(12) United States Patent
Alphonse

(10) Patent No.: US 6,430,207 B1
(45) Date of Patent: Aug. 6, 2002

(54) HIGH-POWER LASER WITH TRANSVERSE MODE FILTER

(75) Inventor: Gerard Argant Alphonse, Princeton, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/396,597

(22) Filed: Sep. 15, 1999

Related U.S. Application Data

(63) Continuation-in-part of application No. 09/246,982, filed on Feb. 9, 1999, now Pat. No. 6,018,536, which is a continuation-in-part of application No. 09/158,847, filed on Sep. 23, 1998, now Pat. No. 6,339,606, which is a continuation-in-part of application No. 09/205,575, filed on Dec. 4, 1998.

(51) Int. Cl.[7] .............................. H01S 5/00; H01S 3/08
(52) U.S. Cl. ............................................ 372/98; 372/46
(58) Field of Search .......................... 372/46, 45, 6, 372/20, 101, 96, 98, 18, 99, 19, 26; 385/37

(56) References Cited

U.S. PATENT DOCUMENTS

| | | | |
|---|---|---|---|
| 3,573,568 A | 4/1971 | Siegel | 257/92 |
| 4,019,196 A | 4/1977 | Teshima et al. | 257/91 |
| 4,764,934 A | 8/1988 | Kwong et al. | 372/46 |
| 4,955,028 A | * 9/1990 | Alferness et al. | 372/20 |
| 4,990,971 A | 2/1991 | Le Creff | 257/88 |
| 5,008,889 A | 4/1991 | Wilson | 372/45 |
| 5,223,722 A | 6/1993 | Nagai et al. | 372/45 |
| 5,309,001 A | 5/1994 | Watanabe et al. | 257/99 |
| 5,537,432 A | 7/1996 | Mehuys et al. | 372/50 |
| 5,953,357 A | * 9/1999 | Hirata et al. | 372/46 |

FOREIGN PATENT DOCUMENTS

| | | |
|---|---|---|
| JP | 61-5585 | 1/1986 |
| JP | 5-145-18 B | 6/1993 |
| WO | WO 97 47042 A | 12/1997 |

OTHER PUBLICATIONS

International Search Report corresponding to PCT Application No. PCT/US99/13568.
Alphonse, G.A. et al.: "New high–power single–mode superluminescent diode with low spectral modulation", Conference on Lasers and Electro–Optics (CLEO), U.S., New York, IEEE, Jun. 4, 1996, pp. 107–108, ISBN: 0–7803–3183–4.
International Search Report, Application No. PCT/US00/25181, mailing date Jul. 31, 2001.

* cited by examiner

*Primary Examiner*—Quyen Leung
(74) *Attorney, Agent, or Firm*—William J. Burke

(57) ABSTRACT

A single-transverse-mode laser has a gain medium and a single-transverse-mode fiber disposed within a resonance cavity. The single-transverse-mode fiber has a filter portion and a partial reflection portion. The filter portion of the single-transverse-mode fiber is coupled to the gain medium and disposed within the resonance cavity. The partial reflection portion of the single-transverse-mode fiber defines one end of the resonance cavity. The gain medium has a double-tapered structure.

20 Claims, 5 Drawing Sheets

HIGH-POWER LASER WITH TRANSVERSE MODE FILTER

CROSS-REFERENCE TO RELATED PATENT APPLICATION

This patent application is a CIP of U.S. patent application Ser. No. 09/158,847, now U.S. Pat. No. 6,339,606 entitled *High Power Semiconductor Light Source* and filed on Sep. 23, 1998, the entire contents of which are incorporated herein by reference; which is a CIP of U.S. patent application Ser. No. 09/246,982, now U.S. Pat. No. 6,018,536 entitled *Multiple-Wavelength Mode-Locked Laser* and filed on Feb. 9, 1999, the entire contents of which are incorporated herein by reference; and which is a CIP pending U.S. patent application Ser. No. 09/205,575, entitled *Light Emitting Semiconductor Device* and filed on Dec. 4, 1998, the entire contents of which are incorporated herein by reference.

BACKGROUND OF THE INVENTION

The present invention relates generally to high-power lasers. More specifically, the present invention relates to a high-power, single-mode laser having both a gain medium and a single-mode filter within the resonance cavity.

Known lasers that produce relatively high output powers often each have a gain medium that produces multiple transverse modes. Such lasers each can produce an output beam having a particular spatial distribution based on the particular multiple transverse modes generated by the gain medium. In other words, different transverse modes produced by a laser have different associated spatial distributions.

These different spatial distributions can be used to select a particular transverse mode or modes (and filter out the remaining transverse mode(s)). For example, it is often desirable to modify a laser (having a gain medium that produces multiple modes) so that its output beam has only a single transverse mode, the fundamental mode.

The fundamental mode can be selected, for example, by placing a spatial aperture within the resonance cavity of the laser to filter certain undesired transverse modes. In addition, the mirrors of the resonance cavity can be designed to favor a particular transverse mode. Alternatively, a particular transverse mode can be selected (and the remaining modes filtered out to varying degrees) by taking advantage of the differences in wavelengths of the multiple transverse modes. For example, a prism located within the resonance cavity can refract the light produced by the gain medium so that only certain transverse modes are reflected by the resonance cavity mirrors.

These different approaches for selecting a particular transverse mode, however, do not work well on lasers producing relatively high output power. Specifically, a gain medium that produces relatively high output powers typically produces a large beam spot (i.e., wide beam cross section) having a relatively high power density. Consequently, it can be difficult to perform mode filtering using techniques that require a narrow beam cross section.

SUMMARY OF THE INVENTION

Disadvantages of the known lasers can be alleviated by embodiments of the present invention. In one embodiment, a single-transverse-mode laser has a gain medium and a single-transverse-mode fiber disposed within a resonance cavity. The single-transverse-mode fiber has a filter portion and a partial reflection portion. The filter portion of the single-transverse-mode fiber is coupled to the gain medium and disposed within the resonance cavity. The partial reflection portion of the single-transverse-mode fiber defines one end of the resonance cavity. The gain medium has a double-tapered structure.

DETAILED DESCRIPTION

Figure 1:
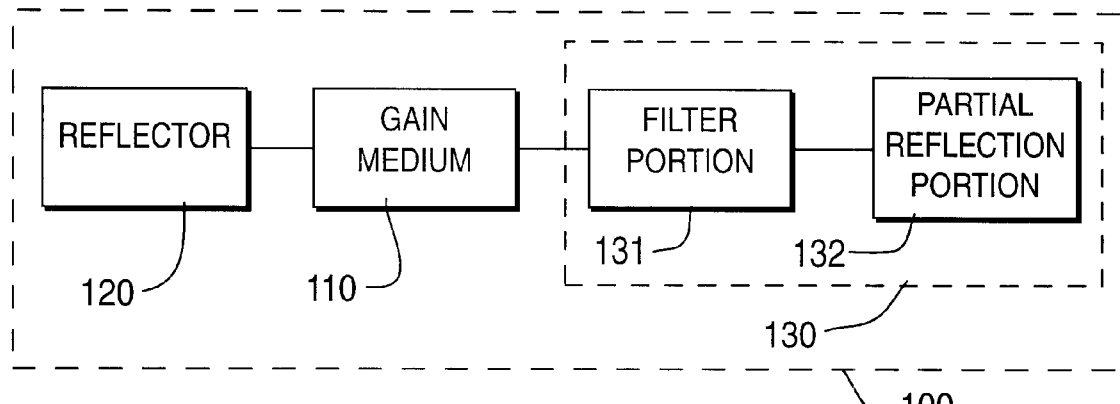
FIG. 1 illustrates a system block diagram of a laser, according to an embodiment of the present invention.

A single-transverse-mode laser has a gain medium and a single-transverse-mode fiber disposed within a resonance cavity. The single-transverse-mode fiber has a filter portion and a partial reflection portion. The filter portion of the single-transverse-mode fiber is coupled to the gain medium and disposed within the resonance cavity. The partial reflection portion of the single-transverse-mode fiber defines one end of the resonance cavity that can be the output end of the laser. The gain medium has a double-tapered structure.

The term "coupled" is used herein to include, but is not limited to, two components being associated such that energy sent by one component is received by the other component. Where the components are optical components sending and receiving light, the optical components can be connected, for example, by an optical fiber(s), fiber-coupling device(s), and/or collimator(s) as appropriate, to maximize the light sent and received. Alternatively, optical components can be coupled by their physical arrangement so that one component sends light along an optical path and the other component receives the light along that path. Where the components are electronic components, they can be coupled by, for example, conventional wiring.

The term "double-tapered structure" is used herein to describe a gain medium having a waveguide configuration with non-parallel walls. The shape of the double-tapered structure can be generically described as a first segment and a second segment, each extending from the first side surface to the second side surface of the body of the gain medium.

The width of the double-tapered structure is defined by the distance between these two segments. The first and second segments of the double-tapered structure are configured such that they are substantially non-parallel, and the width of the double-tapered structure at each end is less than the width of the double-tapered structure between each end. Although only one example of a double-tapered shape is discussed herein for concision, several double-tapered structure shapes are possible and are described in pending U.S. patent application Ser. No. 08/857,920, now abandoned entitled *Light Emitting Semiconductor Device* and filed on May 16, 1997, the entire contents of which are incorporated herein by reference.

The double-tapered structure can be formed in any way that provides a difference between the propagation characteristics between the region inside the double taper and the region outside the double taper. Two such ways include index guiding and gain guiding. Index guiding refers to a small refractive index difference between the regions inside and the regions outside of the double-taper (or guide). Gain guiding refers to a small absorption or gain difference between the regions inside and the regions outside of the double-taper. Index guiding can be accomplished by, for example, a shallow channel being formed on either side of the double-taper to reduce the refractive index within these shallow channels. Alternatively, a relatively deep channel can be formed on either side of the double-taper and a material having a suitable index can be epitaxially regrown. As a result, the guiding characteristics (e.g., due to the refractive index) is different within the double taper and outside the double taper.

Gain guiding can be accomplished by, for example, configuring the metal contact to having the double-tapered shape. As a result, the active medium portion within the double taper has a gain while the active medium portion outside of the double taper has loss. Note that such a metal contact can have the effective double-tapered shape as defined by an underlying dielectric layer even though the metal contact can be disposed over the entire top surface of the LED (as discussed in greater detail below in reference to FIGS. 4 and 5).

Embodiments of the present invention provide relatively high output power through the double-tapered structure of the gain medium combined with the filter portion the single-transverse-mode fiber within the resonance cavity. A gain medium, such as a superluminescent diode (SLD), having a double-tapered structure can produce relatively-high-power light where the higher-order transverse modes (i.e., transverse modes other than the fundamental mode) are minimized. The double-tapered structure allows light to be generated such that the cross-sectional size of the light can be controlled. For example, an SLD having a double-tapered structure can be designed to produce light having a cross sectional spot size of 30 $\mu$m by 1 $\mu$m and to couple to a single-mode fiber with high efficiency using, for example, cylindrical optics.

By controlling the spot size of the high-power light generated from the gain medium, the spot size can be sufficiently small to couple the light efficiently into the filter portion of the single-mode fiber within the resonance cavity, and sufficiently large to avoid damage to the gain medium facet due to impermissible high optical power densities. In other words, the generated beam is sufficiently narrow to couple efficiently into the filter portion of the single-mode fiber, and is sufficiently wide that the portion of the gain medium facet where the beam exits is large enough that the corresponding optical power density is low enough to avoid damaging the gain medium.

Said another way, the spot size of light generated by the gain medium can have an upper constraint and a lower constrain: the spot size (at the single-mode fiber) should be no larger than the filter portion of the single-mode fiber and no smaller (at the gain medium facet) than the point at which damage to the gain medium can occur. By increasing the spot size of the emitting beam larger than that of differently configured gain mediums having the same output power, damage at the gain medium facet can be avoid because the optical power density is lower than would otherwise be the case. Consequently, laser having a gain medium with a double-tapered structure produces light having a single-transverse mode at higher powers than would otherwise be the case.

Moreover, because the single-transverse-mode fiber is included in the resonance cavity, the laser can have high coupling efficiency with other optical components, such as, for example, a transmission fiber of an optical system. In other words, because the output of the laser is produced from a single-mode fiber, the spot size of the transmitted light can be as small as a diffraction-limited spot size and can have a beam divergence determined by the fiber numerical aperture (e.g., approximately 15 degrees).

FIG. 1 illustrates a system block diagram of a laser, according to an embodiment of the present invention. Laser 100 comprises gain medium 110, reflector 120, and portions of single-mode fiber 130, namely filter portion 131 and partial-reflection portion 132. Gain medium 110 produces light to partial reflector 140 through single mode fiber 130 and also produces light along an optical path to reflector 120. The resonance cavity of laser 100 is defined by reflector 120 and partial reflection portion 132 of single-mode fiber 130.

Gain medium 110 is any type of appropriate material that has non-parallel walls, such as an SLD having a double-tapered structure. In alternative embodiments, the gain medium can include a high-power semiconductor light source having multiple SLDs as described in pending U.S. patent application Ser. No. 09/158,847, entitled *High Power Semiconductor Light Source* and filed on Sep. 23, 1998, the entire contents of which are incorporated herein by reference. The SLD is a broad spectral-width optical light source that can function as a broad-band optical amplifier. It can be fabricated to operate at any of the wavelengths for which semiconductor lasers can be made, for example at 980 nm for fiber amplifier pumping and at 1550 nm for optical communications. In the 1550 nm wavelength region, its full-width half-maximum (FWHM) spectral width is 30 to 40 nm, which is equivalent to 4000 GHz (at the peak wavelength).

The partial reflection portion 132 of single-mode fiber 130 defines one end of the resonance cavity so that the filter portion 131 of the single-mode fiber 130 is disposed within the resonance cavity of laser 100. The partial reflection portion 132 of single-mode fiber 130 can be coupled to, for example, a transmission fiber of a communication system (not shown).

In some embodiments of gain medium 110, the output energy can have multiple transverse modes (and possibly multiple longitudinal modes) during lasing action. In other embodiments, the gain medium may only produce the fundamental mode depending on the design. In the embodiments where the light produced by gain medium 110 has multiple transverse modes, the light is coupled into single-mode fiber 130; the filter portion 131 of single-mode fiber 130 only couples light associated with the fundamental mode and thereby acts as a mode filter to exclude the higher order transverse modes. Because the filter portion 131 of single-mode fiber 130 is disposed within the resonance cavity of laser 100, only light associated with the fundamental mode is allowed to travel within the entire resonance cavity. Therefore, only the light associated with the fundamental mode will be amplified and output by laser 100. Due to the high-power design of the gain medium 110, this light associated with the fundamental mode will also have high power.

Any transverse modes excluding the fundamental mode produced by gain medium 110 are filtered out by the filter portion 131 of single-mode fiber 130 within the resonance cavity, thereby preventing these modes from being amplified. Consequently, the output power of the light produced by the laser (i.e., at the fundamental mode) is higher than would be the case with a parallel-wall gain medium (such as, for example, a narrow strip) that produces only a single transverse mode.

Note that the filter portion 131 of single-mode fiber 130 can be configured so that any light reflected from the facet of filter portion 131 facing gain medium 110 is not reflected back into gain medium 110. This prevents separate lasing where the facet of filter portion 131 would define one end of another resonance cavity. Reflection can be directed away from the gain medium 110 by configuring the filter portion 131 of single-mode fiber 130 with an anti-reflection coating on the facet of the filter portion 131 or by configuring the facet of filter portion 131 with a slight angle. Where the facet of filter portion 131 has a slight angle, any reflected light can be reflected away from the gain medium 110.

Figure 2:
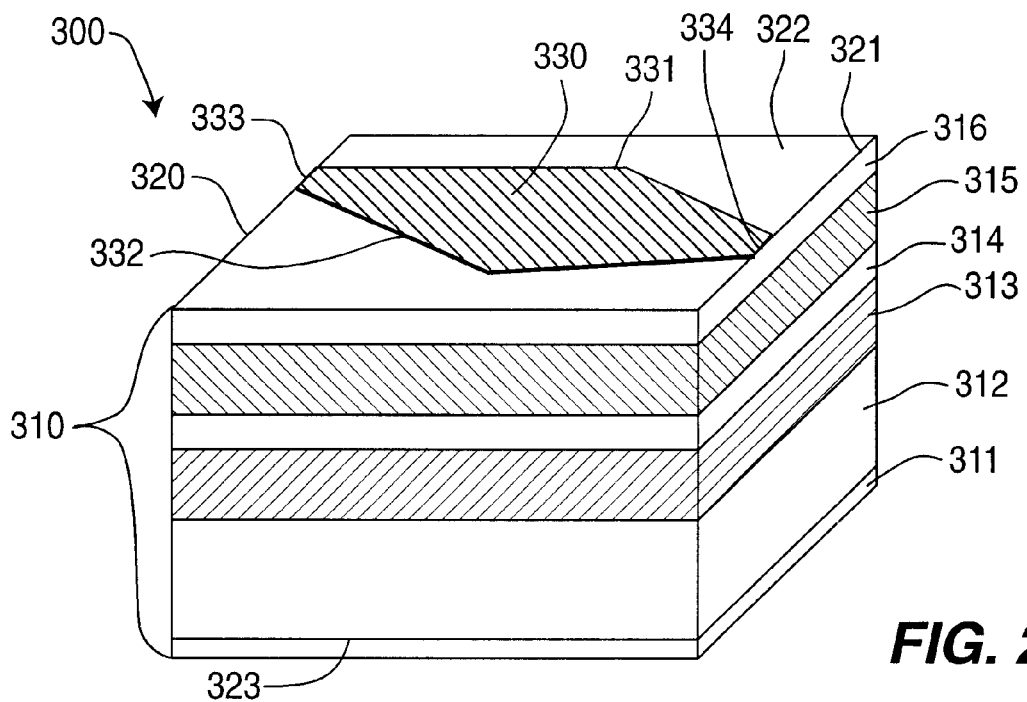
FIG. 2 illustrates an isometric view of a superluminescent diode (SLD) device, according with an embodiment of the present invention.

FIG. 2 illustrates an isometric view of a superluminescent diode (SLD) device, according with an embodiment of the present invention. The light emitting diode 300 comprises a body 310 having a first side surface 320, a second side surface 321, a top surface 322, and a bottom surface 323; and a stripe 330 of conductive material over the top surface 322 of the body 310. The body 310 includes a first electrode 311, a substrate 312, a first clad layer 313, an active layer 314, a second clad layer 315 and a contact 316 of conductive material. Note that for the embodiment shown in FIG. 2, the double-tapered structure is defined by the contact 316 of conductive material.

Figure 3:
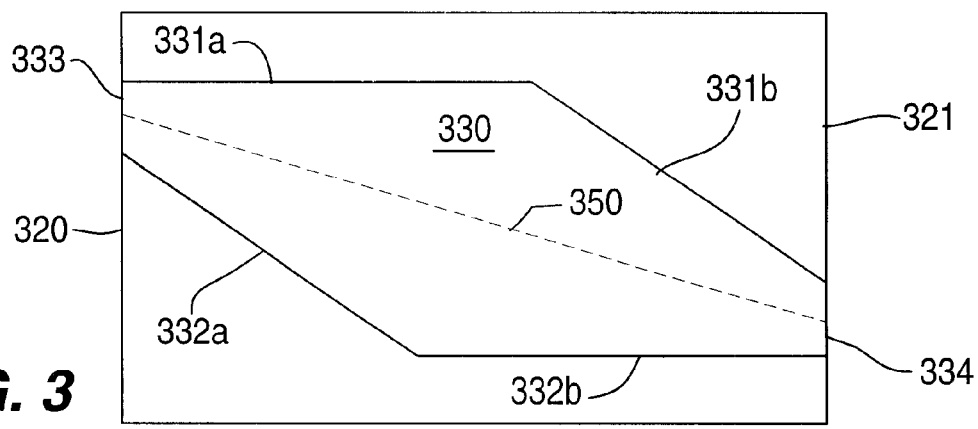
FIG. 3 illustrates a top view of the double-tapered structure for the SLD device shown in FIG. 2.

FIG. 3 illustrates a top view of the double-tapered structure for the SLD device shown in FIG. 2. The double-tapered structure 330 has a first segment 331 and a second segment 332, each of which extends from the first side surface 320 to the second side surface 321. The width of the double-tapered structure 330 is therefore defined by the distance between these two segments 331, 332. The first and second segments 331, 332 of the double-tapered structure 330 are configured such that they are substantially non-parallel to each other, and the width of the double-tapered structure at its ends 333, 334 (i.e., at the first and second side surfaces 320, 321, respectively) is less than the width of the double-tapered structure intermediate the double-tapered structure ends 333, 334.

Figure 4:
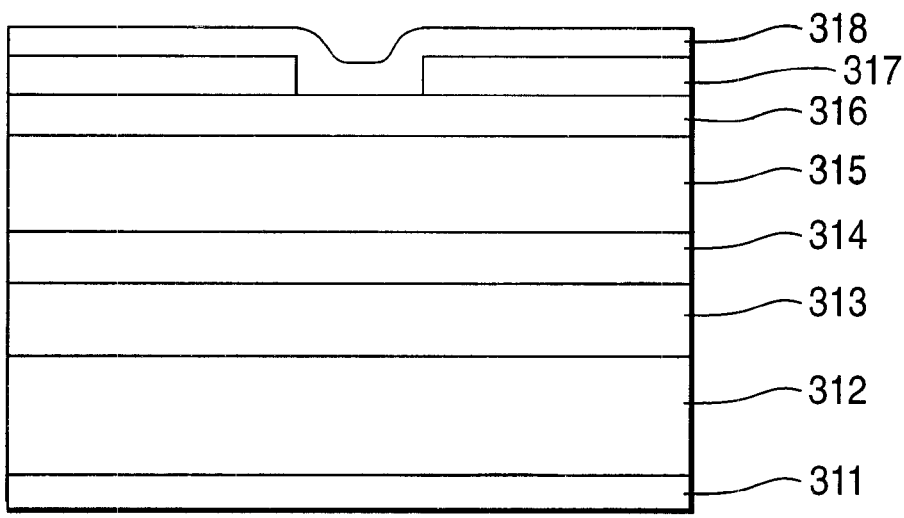
FIG. 4 illustrates a cross-sectional view of the SLD device shown in FIG. 2.

FIG. 4 illustrates a cross-sectional view of the SLD device shown in FIGS. 2 and 3. As shown in FIG. 4, the double-tapered structure is provided by establishing a dielectric layer 317 on the contact 316. The dielectric layer 317 can have a portion removed having a double-tapered shape. This portion can be removed by, for example, masking the portion to remain and etching away the unmasked portion to expose an area of the contact 316 that has a double-tapered shape. Once this potion of the dielectric layer 317 has been removed, a metal layer 318 can be deposited on to the remaining dielectric layer 317 and the exposed contact 316. Although the entire top surface 322 of the body 310 is covered in the metal layer 318, only the portion of the metal layer that is not separated from the contact 316 by the dielectric 317 defines the effective double-tapered shape for the SLD. Consequently, the double-tapered structure is accomplished by this metal layer 318. This type of structure can be referred to as a gain-guided structure.

Figure 5:
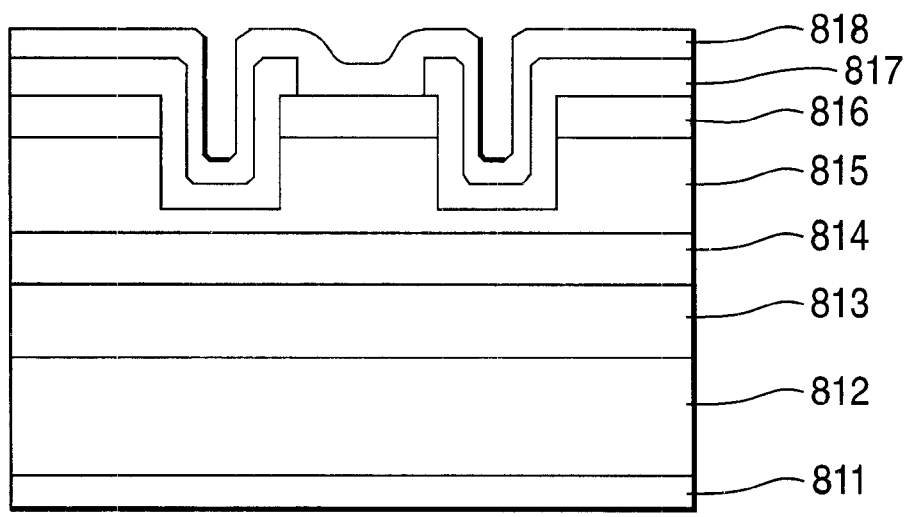
FIG. 5 illustrates a cross-sectional view of a SLD device, according to another embodiment of the present invention

FIG. 5 illustrates a cross-sectional view of an SLD device, according to another embodiment of the present invention. The layers of the device in FIG. 5 are similar to the layers of the device in FIG. 4 and a similar numerical notation is used. The layers of the SLD device in FIG. 5 include a first electrode 811, a substrate 812, a first clad layer 813, an active layer 814, a second clad layer 815, a contact 816, a dielectric layer 817 and a metal layer 318.

The double-tapered structure can be provided by etching two channels extending, for example, into contact 816 and second clad layer 815. Dielectric layer 817 can be deposited on to the entire top surface. The dielectric layer 817 then can have a portion removed having a double-tapered shape. This portion can be removed by, for example, masking the portion to remain and etching away the unmasked portion to expose an area of the contact 816 that has a double-tapered shape. Once this potion of the dielectric layer 817 has been removed, a metal layer 818 can be deposited on to the remaining dielectric layer 817 and the exposed contact 816. Although the entire top surface is covered in the metal layer 818, only the portion of the metal layer that is not separated from the contact 816 by the dielectric 817 is effective for the SLD. Consequently, the double-tapered structure is accomplished by this metal layer 818. This type of structure can be referred to as an index-guided structure.

Further details concerning possible materials, configurations and double-tapered shapes are discussed in pending U.S. patent application Ser. No. 09/205,575, entitled *Light Emitting Semiconductor Device* and filed on Dec. 4, 1998, which is incorporated herein by reference. Although the body 310 of the device 300 is described with specific reference to the substrate, the cladding, the active layers and materials, the present invention includes any electroluminescent structures and materials that result in the production of light in response to the passage of electric current therethrough.

As shown in FIG. 3, which is a top view of the SLD device shown in FIG. 2, the boundaries of the double-tapered structure 330 are defined by the first segment 331, the second segment 332, and the first and second body sides 320 and 321, which intersect the double-tapered structure 330 to form respective double-tapered structure ends 333 and 334. The width of the double-tapered structure 330 is defined by the distance between the first and second segments 331 and 332. In this embodiment, each of the first and second segments 331 and 332 comprise a first segment side 331*a* and 332*a*, and a second segment side 331*b* and 332*b*. As in all embodiments of the present invention, the width of the first and second double-tapered structure ends 333 and 334 are each less than the width of the double-tapered structure 330 intermediate the first and second double-tapered structure ends 333 and 334. For convenient reference, the shape of the double-tapered structure shown in FIGS. 2 and 3 can be referred to as a diamond.

The configuration of the double-tapered structure provides many advantages. For example, where the double-tapered structure is a gain-guided structure, the metal contact has an effective shape of a double taper. By applying a voltage across the double-tapered structure 330 of the metal contact 316 and across the first electrode 311, an electric current is passed through the active layer 314. The active layer 314, which comprises an electroluminescent material, thereby generates light in a region that corresponds in shape to that of the double-tapered structure. In accordance with the present invention, the double-tapered structure is configured such that the power of the device 300 is maximized and the formation of high-order transverse modes is minimized. In addition, the device 300 remains amenable to coupling with other devices such as single-mode fibers. This improved coupling to, for example, a single-mode fiber is possible because the double-tapered structure produces light having a relatively narrow beam width which can be more easily coupled into the single-mode fiber.

Figure 6:
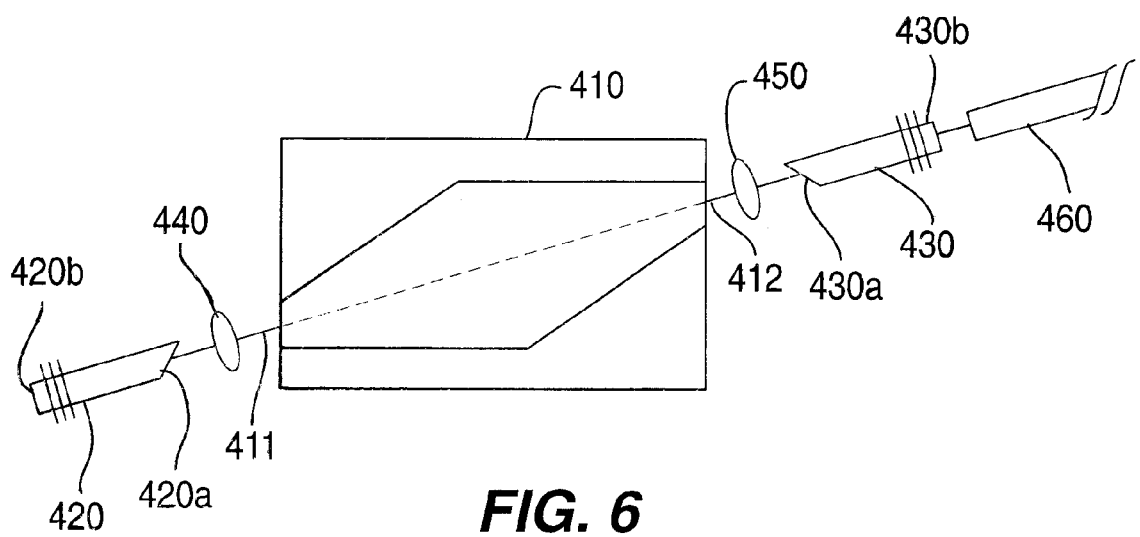
FIG. 6 illustrates a top view of a laser having a doubled-tapered SLD gain medium, according to another embodiment of the present invention.

FIG. 6 illustrates a top view of a laser having a doubled-tapered SLD gain medium, according to another embodiment of the present invention. Gain medium 410 has a doubled-tapered SLD configuration and produces light along optical paths 411 and 412. Light propagating along optical path 411 is coupled into a reflector 420 by coupling optics 440. In this embodiment, the reflector 420 is an optical fiber having fiber ends 420a and 420b. An in-fiber reflector is located at fiber end 420b and can have, for example, about 100% reflectance. In other embodiments, the reflectance of the in-fiber reflector can be less than 100%.

Light propagating along optical path 412 is coupled into single-transverse-mode fiber 430 by coupling optics 450. Single-transverse-mode fiber 430 has fiber ends 430a and 430b. Light transmitted out of fiber end 430b can be directly coupled, for example, into a transmission fiber 460 of an optical system. Single-transverse-mode fiber 430 can have a filter portion and a partial-reflection portion. The partial reflection portion of the single-transverse-mode fiber 430 can be, for example, an in-fiber reflector at fiber end 430b with a reflectance less than 100% so that a portion of the light can be transmitted from the laser to, for example, the transmission fiber 460 of an optical system.

Note that although only fiber 430 is referred to as a single-transverse-mode fiber, fiber 420 can also be a single-transverse-mode fiber in combination with fiber 430 or instead of fiber 430. In other words, at least one of either fibers 420 and 430 is a single-transverse-mode fiber.

Coupling optics 440 and 450 can be any sort of appropriate optical components that can couple light from the gain medium 410 into the single mode fibers 420 and 430. For example, coupling optics 440 and 450 can be a lens or series of lens as appropriate, or some type of collimator. Because the beam shape of the light produced by the gain medium is rectangular (e.g., 30 $\mu$m by 1 $\mu$m), the coupling optics 440 and 450 can include cylindrical lens.

Fiber 420 and 430 can be configured so that they do not reflect light back into gain medium 410 from fiber ends 420a and 430a. In other words, fiber ends 420a and 430a are configured to avoid reflecting undesired light back to gain medium 410 by beveling fiber ends 420a and 430a. More specifically, light propagating along optical path 411 can be coupled into fiber end 420a through coupling optics 440 and reflection from beveled fiber end 420a can be avoided; light coupled into fiber 420 can be reflected by the in-fiber reflector, exit fiber end 420a, propagate along optical path 411, reenter gain medium 410. Similarly, light propagating along optical path 412 can be coupled into fiber end 430a through coupling optics 450 and reflection from beveled fiber end 430a is avoided; light coupled into fiber 430 can propagate along the length of fiber 430 have a portion of the light reflected by a partial reflection portion of fiber 430. The remaining portion of the light can be transmitted out of fiber 430 and directly coupled into transmission fiber 460 of an optical system.

Figure 7:
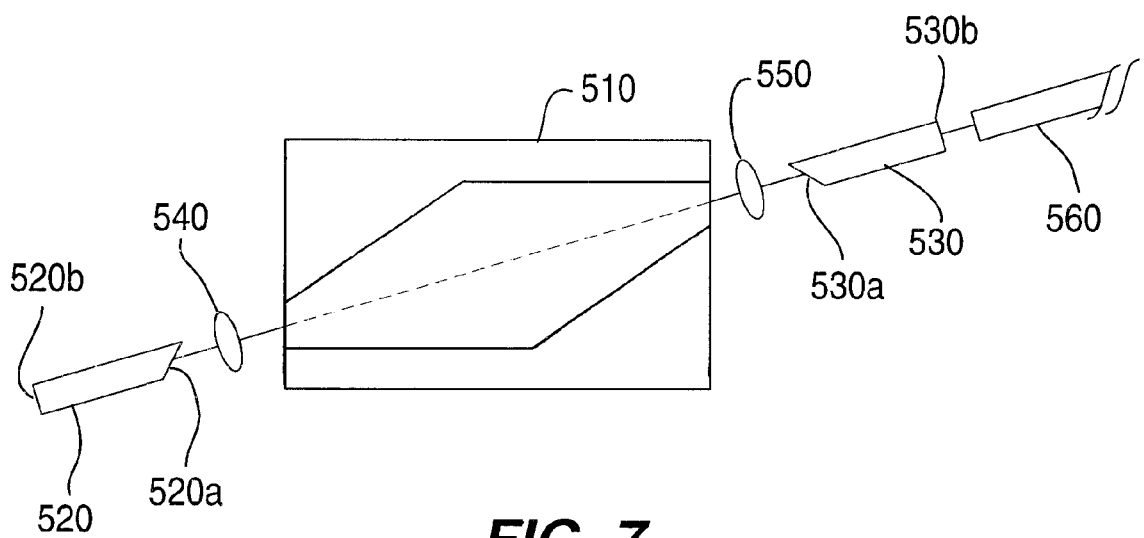
FIG. 7 illustrates a top view of a laser having a doubled-tapered SLD gain medium, according to another embodiment of the present invention.

FIG. 7 illustrates a top view of a laser having a doubled-tapered SLD gain medium, according to another embodiment of the present invention. Gain medium 510 is optically coupled to fiber 520 via coupling optics 540, and gain medium 510 is coupled to single-transverse-mode fiber 530 via coupling optics 550. Single-transverse-mode fiber 530 is coupled to, for example, transmission fiber 560 of an optical system. Again, note that although only fiber 530 is referred to as a single-transverse-mode fiber, fiber 520 can also be a single-transverse-mode fiber in combination with, or instead of, fiber 530.

Fiber 520 includes fiber ends 520a and 520b. A reflector can be incorporated into fiber 520 (rather than being incorporated within the fiber) by coating fiber 520b so that fiber end 520b is highly reflective (e.g., 100% reflection). This configuration allows all light that is coupled into fiber 520 at fiber end 520b to be highly reflected out of fiber end 520a and back along the optical path from which the light was received. Note that fiber end 520a can be beveled to avoid reflection of light back into the gain medium 510.

Fiber 530 includes fiber ends 530a and 530b. Fiber end 530b can be uncoated or coated to obtain a desirable reflection thereby controlling the percentage of light reflected and the percentage of light transmitted to transmission fiber 560. More specifically, in the case where fiber end 530b is uncoated, approximately 4% of the received light will be reflected back towards gain medium 510 and 96% of the light will be transmitted to fiber 560. Alternatively, where the coating at fiber end 530b is used to control the desired reflection, the specific amount of light reflected back towards gain medium 510 can be controlled as well as the percentage of light transmitted to transmission fiber 560. Note that fiber end 530a can be beveled to avoid reflection of light back into the gain medium 510.

Figure 8:
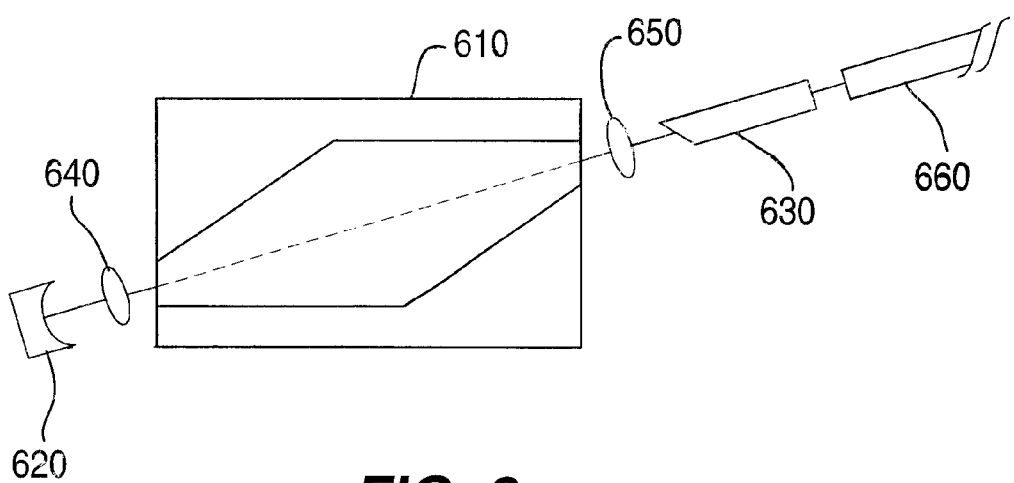
FIG. 8 illustrates a top view of a laser having a double-tapered SLD gain medium, according to yet another embodiment of the present invention.

FIG. 8 illustrates a top view of a laser having a double-tapered SLD gain medium, according to another embodiment of the present invention. Gain medium 610 is coupled to reflector 620 by coupling optics 640. Similarly, gain medium 610 is coupled to single mode fiber 630 by coupling optics 650. Single-transverse-mode fiber 630 can also be coupled to, for example, transmission fiber 660 of optical system (not shown). In this embodiment, reflector 620 can be any sort of mirror that reflects a majority of the light, for example, about 100% percent of the light, back to gain medium 610 from where it was received. For example, reflector 620 can be a concave mirror having a curvature appropriate to reflect all of the received light back towards gain medium 610 through coupling optic 640.

Figure 9:
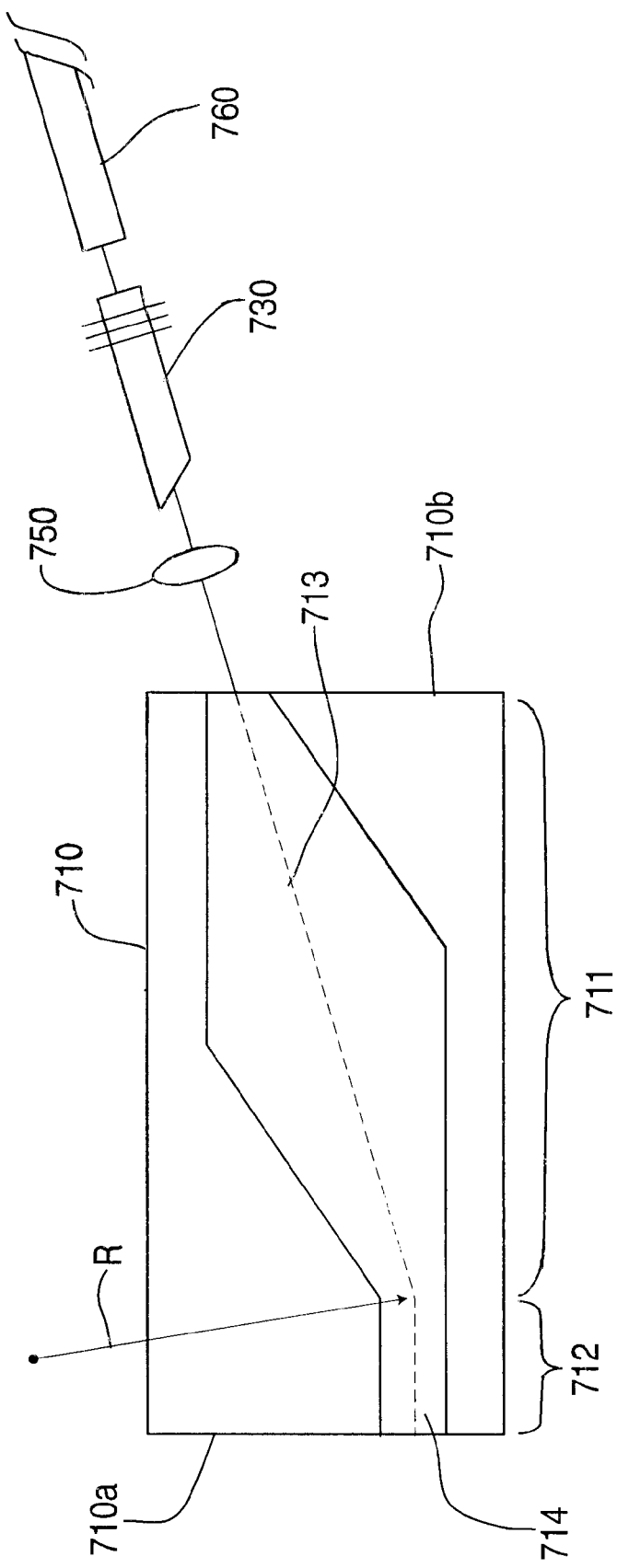
FIG. 9 illustrates a top view of a laser having a double-tapered SLD gain medium, according to yet another embodiment of the present invention.

FIG. 9 illustrates a top view of a laser having a double-tapered SLD gain medium, according to yet another embodiment of the present invention. In this embodiment, gain medium 710 has a double-tapered structure that includes a double-tapered portion 711 and a transmission portion 712. The double-tapered structure of gain medium 710 has a side surface 710a and a side surface 710b (as shown in FIG. 9, these side surfaces perpendicular into the page). Gain medium 710 is optically coupled to single-transverse-mode fiber 730 via coupling optics 750. Single-transverse-mode fiber 730 can include a filter portion and a partial-reflection portion allowing a portion of the light to be reflected back towards gain medium 710 and a portion to be transmitted. Single-transverse-mode fiber 730 can be coupled to transmission fiber 760.

The transmission portion 712 of gain medium 710 is arranged so that it is substantially perpendicular to the side surface of gain medium 710 (e.g., within a fraction of a degree of normal, or even 1 or 2 degrees of normal). The double-tapered portion 711 of gain medium 710 is arranged as discussed above in reference to the double-tapered structure. The exterior of side surface 710a of gain medium 710 can include a high reflective coating. For example, side surface 710 a can have a coating that allows about 100% of the light generated within gain medium 710 to be internally reflected. The side surface 710b of gain medium 710 can include an anti-reflection coating. For example, side surface 710b can have an anti-reflection coating that allows 5–10% of the light generated within gain medium 710 to be internally reflected and the remaining 90–95% of the light to be transmitted towards coupling optics 730.

The arrangement of transmission portion 712 being perpendicular to side surface 710a allows for the physical incorporation of a reflector into gain medium 710. In other words, rather than having a reflector external to the gain medium (see, e.g., the discussion above relating to FIGS. 3 to 8) that defines one end of the resonance cavity, light generated within the gain medium 710 can be reflected at side surface 710a without the use of an external reflector. Accordingly, side surface 710a defines one end of the resonance cavity and the partial-reflection portion of single mode fiber 730 defines the other end of the residence cavity. This embodiment provides a more compact and more reliable laser because at least one component external to the gain medium is eliminated while still allowing the gain medium to produce high power light.

Double-tapered portion 712 is arranged with transmission portion 711 of gain medium 710 so that these two portions are curved together. The shape of the double-tapered portion 712 has a centerline 713; the transmission portion 711 has centerline 714. Centerlines 713 and 714 are contiguous in such a manner that they define a curve having a radius of curvature, R, defined by the following equation:

$$R \geq \frac{3}{\pi} \frac{n_1^2}{(n_1^2 - n_2^2)^{3/2}} \lambda$$

where, $n_1$ is the waveguide effective refractive index corresponding to the location within the double-tapered structure, $n_2$ is the lateral refractive index within the gain medium corresponding to the locations outside the double-tapered structure, $\lambda$ is the wavelength of the light produced within the gain medium 710.

By arranging the double-tapered portion 712 with the transmission portion 711 so that their centerlines 713 and 714, respectively, are curved, the production of light having higher order transverse modes can be minimized within the double-tapered portion 712 while allowing the light produced within the gain medium 710 to arrive substantially perpendicular to the side surface 710a (thereby allowing the light to be internally reflected without an external reflector). In one embodiment, for example, $n_1$ can equal about 3.2, $n_2$ can equal about 3.19, $\lambda$ can equal about 1 $\mu$m; in this embodiment, the radius of curvature for the center axis of the double-tapered portion 712 and transmission portion 711 is about 0.6 mm.

Figure 10:
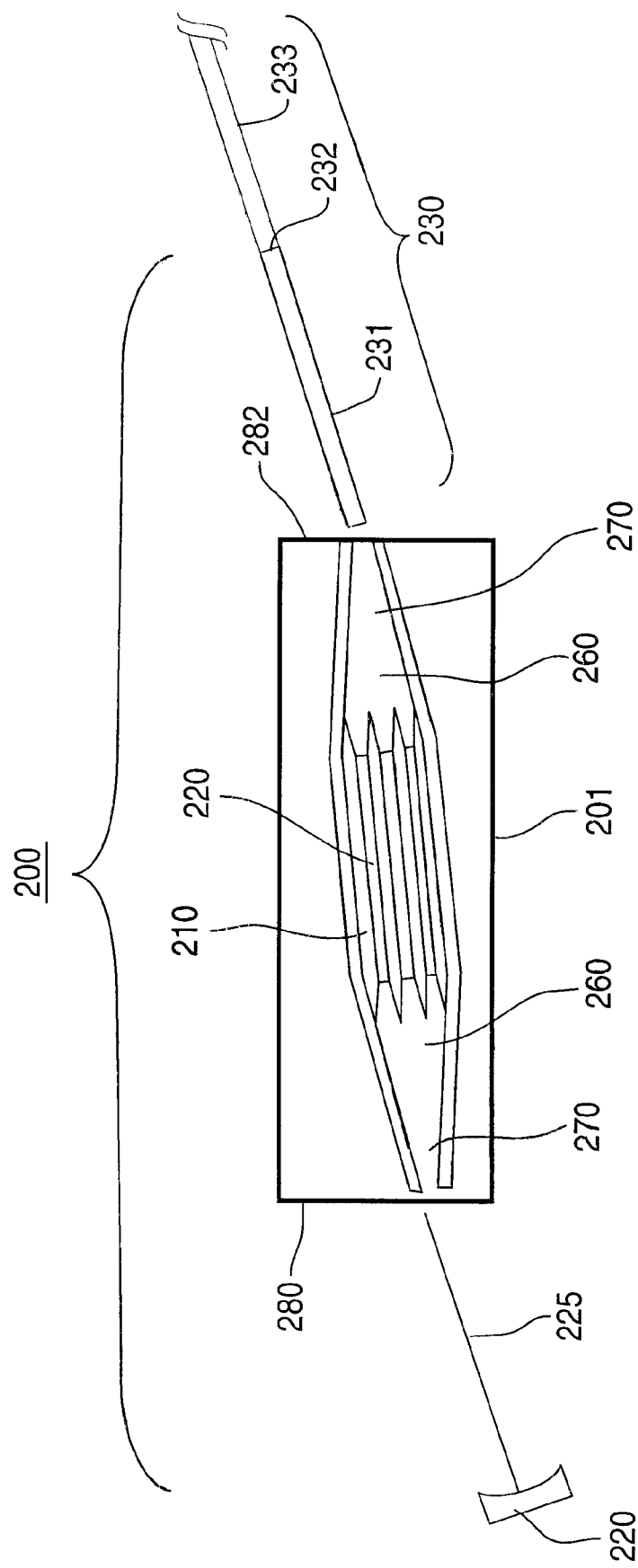
FIG. 10 illustrates a top view of a laser having a SLD configuration, according to another embodiment of the present invention.

FIG. 10 illustrates a top view of a laser having an SLD configuration, according to another embodiment of the present invention. Laser 200 includes gain structure 201, filter portion 231 and partial reflection portion 232 of single-mode fiber 230, and reflector 220.

Gain structure 201 includes a monolithic array of several individual tapered thin active ridge diamond-like structures 210 arranged in parallel and separated by narrow channels 220. In other words, the diamond-like structures 210 can be index-guided structures where the narrow channels 220 are the index-modified channels for two adjacent index-guided, diamond-like structures 210. Gain structure 201 also includes a mode expander region 260 and a taper portion 270 on each end of the diamond-like structures 210.

Diamond-like structures 210 are the regions of gain structure 201 that are the active gain medium of laser 200. Structures 210 have a diamond-like shape in the sense that the stripe of conductive material has substantially non-parallel sides and ends that are more narrow than intermediate portions of the stripe. A more detailed description of these structures 210 can be found in co-pending, commonly assigned U.S. patent application Ser. No. 09/158,847, entitled *High Power Semiconductor Light Source* and filed on Sep. 23, 1998, the entire contents of which are incorporated herein by reference.

The length of the diamond-like structures 210 within gain structure 201 need not be the same. The width of the diamond-like structures 210 at their widest can be for example, 20 to 30 $\mu$m. The width of the channels 220 can be as narrow as about 5 $\mu$m. The width should be sufficient to prevent the fields generated in the individual diamond-like structures 210 from overlapping and sufficient to allow those fields to overlap in the mode expander region 260 beyond the individual tapered portions of the diamond-like structures 210.

Mode expander region 260 can have a relatively long (for example, about 1 to 2 mm) tapered waveguide shape that includes a taper region 270. Mode expander region 260 and taper region 270 are passive portions of the gain structure 201. The refractive index of the mode expander region 260 can be slightly lower than the refractive index of the diamond-like structures 210. Consequently, as light propagates out of the diamond-like structures 210, the light expands into the low refractive index mode expander region 260.

As light propagates through mode expander region 260, the light is tapered toward the facets 280 and 282 of gain structure 201 by taper regions 270. A description of an SLD with a mode expander can be found in co-pending, commonly assigned U.S. patent application Ser. No. 08/946,180, which is incorporated herein by reference in its entirety.

Light propagating from the facet 282 of gain structure 201 is coupled into the filter portion 231 of single-mode fiber 230. All transverse modes excluding the fundamental mode are filtered out by the filter portion 231 of single-mode fiber 230 within the resonance cavity, thereby preventing these modes from being amplified. Partial reflection portion 232 of single-mode fiber 230 can transmit a portion of the light for output of the laser 200 and can reflect a portion of light. Light propagating from the facet 280 travels along optical path 225 to reflector 220 where the light is reflected back along optical path 225 to facet 280.

Light propagates within the resonance cavity defined by reflector 220 and the partial reflection portion 232 of single-mode fiber 230. Light exits the resonance cavity through partial reflection portion 232 of single-mode fiber 230 to transmission portion 233 of single-mode fiber 230 which, in turn, can be coupled directly into a transmission optical fiber (not shown). The filter portion 231, partial reflection portion 232 and transmission portion 233 of single-mode fiber 230 can be integrally formed with a transmission optical fiber (not shown) coupled to transmission portion 233 of single-mode fiber 230.

The output of laser 200 can be high power with a single transverse mode. The particular output power of laser 200 is based on the number of diamond-like structures 210 within the gain structure 201. The output power of laser 200 can be for example, 10 to 100 watts.

It should, of course, be understood that while the present invention has been described in reference to particular configurations, other configurations should be apparent to those of ordinary skill in the art. For example, although some embodiments of the present invention have been discussed in reference to a reflector in the resonance cavity, other components are possible, such as an optical fiber having a grating or reflector in the fiber.

In another embodiment of the present invention, the gain medium can include a mode expansion region so that the active layer has tapered ends that each extend into the mode expansion region as described in pending U.S. patent application Ser. No. 09/158,847, entitled *High Power Semiconductor Light Source* and filed on Sep. 23, 1998, which is incorporated herein by reference (see, e.g., FIGS. 5(a) and (b) and the associated description). By including a mode expansion region within the gain medium, the gain medium can produce high power light and improve coupling efficiency to the single-transverse-mode fiber external to the gain medium.

In yet another embodiment of the present invention, the laser can be operated as a mode-locked system by applying a direct-current (DC) bias current together with a current from a high-frequency radio-frequency (RF) source. The RF signal modulates the gain of the gain medium by increasing the gain during the positive swing of the RF signal and shutting off the gain during the negative swing of the RF signal. Such a mode-locked configuration is discussed in further detail in pending U.S. patent application Ser. No. 09/246,982 now U.S. Pat. No. 6,018,536 entitled *Multiple-Wavelength Mode-Locked Laser*, filed on Feb. 9, 1999 and incorporated herein by reference.

Embodiments of the present invention can be bundled together to supply non-coherent power. In other words, multiple lasers of the present invention each coupled to transmission fiber can be combined together by, for example, etching the fiber clads of each transmission fiber to reduce their diameters and inserting them into a glass ferrule, and fusing them together to create a bundle of a desired diameter. For example, by etching the fiber clads to a 30 μm diameter each, 10 lasers can be bundled together into a unit with a 100 μm diameter.

What is claimed is:

1. A single-transverse-mode laser having a resonance cavity, comprising:
    a gain medium disposed within the resonance cavity, said gain medium having a double-tapered structure; and
    a single-transverse-mode fiber having a filter portion and a partial reflection portion, the filter portion of said single-transverse-mode fiber being coupled to said gain medium and disposed within the resonance cavity, the partial reflection portion of said single-transverse-mode fiber defining one end of the resonance cavity.

2. The single-transverse-mode laser of claim 1, wherein:
    said gain medium includes a transmission portion and a double-taper portion, the transmission portion having a centerline perpendicular to a side surface of said gain medium, the side surface of said gain medium defining a second end of the resonance cavity.

3. The single-transverse-mode laser of claim 1, wherein:
    said gain medium includes a transmission portion having a centerline and includes a double-taper portion having a centerline, the transmission portion centerline and the double-taper centerline defining a curve.

4. The single-transverse-mode laser of claim 3, wherein the curve having a $$R \geq \frac{3}{\pi} \frac{n_1^2}{(n_1^2 - n_2^2)^{3/2}} \lambda$$

radius of curvature defined by the following equation:
    $n_1$ being a waveguide effective refractive index within said gain medium, $n_2$ being a lateral refractive index within said gain medium, and $\lambda$ being the wavelength of the light produced within said gain medium.

5. The single-transverse-mode laser of claim 1, wherein:
    said gain medium includes a body having a first side surface, a second side surface, and a top surface, said body including an active layer for generating light;
    the double-tapered structure being within the body, the double-tapered structure having a first segment and a second segment;
    the width of the double-tapered structure is defined by the distance between said first and second segments;
    said first and second segments each extend from the first side surface to the second side surface of said body;
    said first and second segments of the double-tapered structure are substantially non-parallel;
    said first and second segments of the double-tapered structure are separated by a distance at the first and second side surfaces of said body to form respective first and second double-tapered structure ends; and
    the width of said first and second double-tapered structure ends are each less than the width of said double-tapered structure intermediate said first and second double-tapered structure ends.

6. The single-transverse-mode laser of claim 1, further comprising:
    a reflector coupled to said gain medium and defining a second end of the resonance cavity.

7. The single-transverse-mode laser of claim 1, wherein:
    said gain medium includes a body having a first side surface and a second side surface, and
    the first side surface and the second side surface of said gain medium each having an antireflection coating exterior to the body of said gain medium.

8. The single-transverse-mode laser of claim 1, wherein the double-tapered structure of said gain medium has a portion substantially perpendicular to the first side surface of a body of said gain medium,
    the first side surface of the body of said gain medium defining a second end of the resonance cavity.

9. The single-transverse-mode laser of claim 1, wherein said gain medium includes a plurality of superluminescent diodes (SLDs) each having a double-tapered conductive material.

10. A method for producing light having a single transverse-mode, comprising:
    generating light from a gain medium disposed within a resonance cavity, the gain medium having a double-tapered structure;
    filtering out, within the resonance cavity, light having at least one higher order transverse mode if the light generated by the gain medium includes at least one higher order transverse mode;
    transmitting the light having only a fundamental mode through a single-transverse-mode fiber having a filter portion and a partial reflection portion, the partial reflection portion of the single-transverse-mode fiber defining one end of the resonance cavity.

11. The method of claim 10, wherein the light having at least one higher order transverse mode is eliminated by the filter portion of the single-transverse mode fiber disposed within the resonance cavity.

12. The method of claim 10, wherein the generated light has an output beam with a beam width compatible with the numerical aperture of associated with the single-transverse-mode gain medium.

13. The method of claim 10, wherein:
the gain medium includes a transmission portion and a double-taper portion, the transmission portion having a centerline perpendicular to a side surface of the gain medium, the side surface of said gain medium defining a second end of the resonance cavity.

14. The method of claim 10, wherein:
the gain medium includes a transmission portion having a centerline and includes a double-taper portion having a centerline, the transmission portion centerline and the double-taper centerline defining a curve.

15. The method of claim 14, wherein the curve having a radius of curvature $$R \geq \frac{3}{\pi} \frac{n_1^2}{(n_1^2 - n_2^2)^{3/2}} \lambda$$

radius of curvature defined by the following equation:
$n_1$ being a waveguide effective refractive index within said gain medium, $n_2$ being a lateral refractive index within said gain medium, and $\lambda$ being the wavelength of the light produced within said gain medium.

16. The method of claim 10, wherein:
the gain medium includes a body having a first side surface, a second side surface, and a top surface, the body including an active layer for generating light;
the double-tapered structure being within the body, the double-tapered structure having a first segment and a second segment;
the width of the double-tapered structure is defined by the distance between the first and second segments;
the first and second segments each extend from the first side surface to the second side surface of the body.
the first and second segments of the double-tapered structure are substantially non-parallel;
the first and second segments of the double-tapered structure are separated by a distance at the first and second side surfaces of said body to form respective first and second double-tapered structure ends; and
the width of the first and second double-tapered structure ends are each less than the width of the double-tapered structure intermediate the first and second double-tapered structure ends.

17. The method of claim 10, wherein a reflector is coupled to the gain medium and defines a second end of the resonance cavity.

18. The method of claim 10, wherein the gain medium includes a body having a first side surface and a second side surface,
the first side surface and the second side surface of the gain medium each having an antireflection coating exterior to the body of the gain medium.

19. The method of claim 10, wherein the double-tapered structure of the gain medium has a portion substantially perpendicular to the first side surface of a body of the gain medium,
the first side surface of the body of the gain medium defining a second end of the resonance cavity.

20. The method of claim 10, wherein the gain medium includes a plurality of superluminescent diodes (SLDs) each having a double-tapered conductive material.

* * * * *